US006836157B2

(12) United States Patent
Rader et al.

(10) Patent No.: US 6,836,157 B2
(45) Date of Patent: Dec. 28, 2004

(54) METHOD AND APPARATUS FOR DRIVING LEDS

(75) Inventors: William E. Rader, Carrboro, NC (US); Ryan P. Foran, Bullock, NC (US)

(73) Assignee: Semtech Corporation, Morrisville, NC (US)

( * ) Notice: Subject to any disclaimer, the term of this patent is extended or adjusted under 35 U.S.C. 154(b) by 67 days.

(21) Appl. No.: 10/434,857

(22) Filed: May 9, 2003

(65) Prior Publication Data

US 2004/0233144 A1 Nov. 25, 2004

(51) Int. Cl.[7] .............................. H03K 5/22; G05F 1/00

(52) U.S. Cl. ........................... 327/66; 327/64; 315/291; 315/307

(58) Field of Search .............................. 327/66, 64, 68; 315/291, 307, 312

(56) References Cited

U.S. PATENT DOCUMENTS 6,496,168 B1 * 12/2002 Tomida ....................... 345/76

* cited by examiner

*Primary Examiner*—Tuyet Thi Vo

(74) *Attorney, Agent, or Firm*—Coats & Bennett, P.L.L.C.

(57) ABSTRACT

A plurality of LEDs is driven in parallel, in at least two modes. In a first mode, the LEDs are driven with a first voltage. In subsequent modes, the LEDs are driven with successively higher voltages. The forward voltage drop for each LED is monitored, and the driver switches from the first mode to successive modes based on the largest of the LED forward voltage drops. The current through each LED is controlled by directing a reference current through a first digitally controlled variable resistance circuit, and directing the LED current through a second digitally controlled variable resistance circuit having substantially a known ratio to the first variable resistance circuit and connected in series with the LED. A digital count is altered based on a comparison of the first and second currents, and the first and second variable resistance circuits are simultaneously altered based on the digital count.

13 Claims, 6 Drawing Sheets

METHOD AND APPARATUS FOR DRIVING LEDS

BACKGROUND OF THE INVENTION

The present invention relates generally to battery-powered circuits for LEDs, and particularly to a system and method of driving LEDs.

Rechargeable batteries are utilized as a power source in a wide variety of electronic devices. In particular, rechargeable batteries are utilized in portable consumer electronic devices such as cellular telephones, portable computers, Global Positioning System (GPS) receivers, and the like. Many of these devices employ a rechargeable lithium ion battery, with a typical output voltage in the range of 3V to 4.2V.

A fairly recent development in solid state electronics is the development of the white-light LED. White LEDs offer significant advantages over alternative white-light sources, such as small incandescent bulbs or fluorescent lights. Among these are greater efficiency (resulting in lower heat generation and lower power consumption for a given level of illumination), increased operating life, and superior ruggedness and shock resistance. White LEDs are often employed in portable electronic devices, such as to back-light an LCD display screen. Like all LEDs, the Intensity of light emitted by a white LED varies as a function of the DC current through it. In many applications, it is highly desirable to allow the user to adjust or select the light intensity. Additionally, where a plurality of white LEDs are employed, it is often desirable that they all be driven to the same intensity level.

The forward voltage drop of a white light LED is typically in the range of 3V to 3.8V. As this voltage drop is close to, or may exceed, the output voltage of a lithium ion battery, power for white LEDs is typically supplied from the battery through a DC-DC boost converter, such as a charge pump. These converters boost the output voltage of the battery to a level much greater than the forward voltage of the white LEDs. While this provides sufficient drive to power the LEDs, the inefficiency of the boost converter potentially wastes limited battery power.

With increasing power management sophistication, circuit miniaturization, low ambient power circuits, and the reduced bandwidth of many digital communications, portable electronic devices are often operated in a variety of "low-power" modes, wherein some features and/or circuits are inactive or operate at a reduced capacity. As one example, many newer cellular telephones include an "internet mode," displaying text data (such as on an LCD screen) that is transmitted at a very low data rate as compared to voice communications, thus consuming low levels of power and extending battery life. A typical current budget for a cellular telephone in this mode is around 200 mA. Such a phone typically utilizes three white LEDs, at 20 mA each, to back-light the display. The LED current thus accounts for approximately 30% of the total battery current. In such an application, an efficient method of supplying power to the LEDs would have a significant effect on battery life.

Another challenging issue facing designers is that the forward voltage drop of white LEDs varies significantly. For example, two LEDs chosen at random from the same production run could have forward voltages that vary by as much as 200 mV. Thus, an efficient current supply design for biasing white LEDs, which preserves good current matching between diodes with different forward voltages, would represent a significant advance in the state of the art, as it would ensure uniform illumination.

FIG. 1 depicts a typical discharge pattern of a lithium ion battery. Curve 1 represents the battery discharge pattern at an ambient temperature of 25° C.; curve 2 represents the battery discharge profile at an ambient temperature of 35° C. As FIG. 1 illustrates, while the output of a lithium ion battery may vary between approximately 2.5V and 4.2V, for approximately 95% of the lithium Ion battery's lifetime, its output voltage exceeds 3.5V. Thus, if the battery is driving white LEDs with forward voltages of less than approximately 3.5V, it should be possible to drive the diodes directly from the battery, obviating the need to boost the battery output by a DC-DC converter.

In practice, this is problematic for at least two reasons. First, each white LED current source must impose only a very small voltage drop, and regulate a current value that may vary over an order of magnitude or more for brightness control. In addition, each LED will require a separate current source, due to the wide variation in forward voltage drops across white LEDs.

Second, as the battery output voltage drops towards the end of the battery's lifetime, a provision must be made for first detecting this condition, and then boosting the battery output to provide sufficient current to power all white LEDs at the required intensity level.

SUMMARY OF THE INVENTION

In one aspect, the present invention relates to a method of driving a plurality of LEDs in parallel, in at least two modes. In a first mode, the LEDs are driven with a first voltage, which may comprise a battery voltage. In a second mode, the LEDs are driven with a second, higher voltage, which may comprise a boost converter voltage. The method includes monitoring the forward voltage drop for each LED, and switching from the first mode to the second mode based on the largest of the LED forward voltage drops.

In another aspect, the present invention relates to a method of controlling the current through an LED. The method includes directing a first, predetermined current through a first digitally controlled variable resistance circuit, and directing a second current through a series circuit comprising the LED and a second digitally controlled variable resistance circuit having substantially a known ratio to the first variable resistance circuit. A digital count is altered based on a comparison of the first and second currents, and the first and second variable resistance circuits are simultaneously altered based on the digital count. In one embodiment, a digital counter is incremented or decremented based on a comparison of the voltage drops across the first and second variable resistance circuits.

In yet another aspect, the present invention relates to a method of independently controlling the current through a plurality of LEDs. Each LED is connected in series with a variable resistance circuit, and a current control source operative to alter the resistance of the variable resistance circuit so as to maintain the current through the LED at a known multiple of a local reference current. Each current control source is provided a master reference current determined by the value of a resistive element, and the master reference current is multiplied by a predetermined factor for each LED to generate the local reference current.

DETAILED DESCRIPTION OF THE INVENTION

Figure 1:
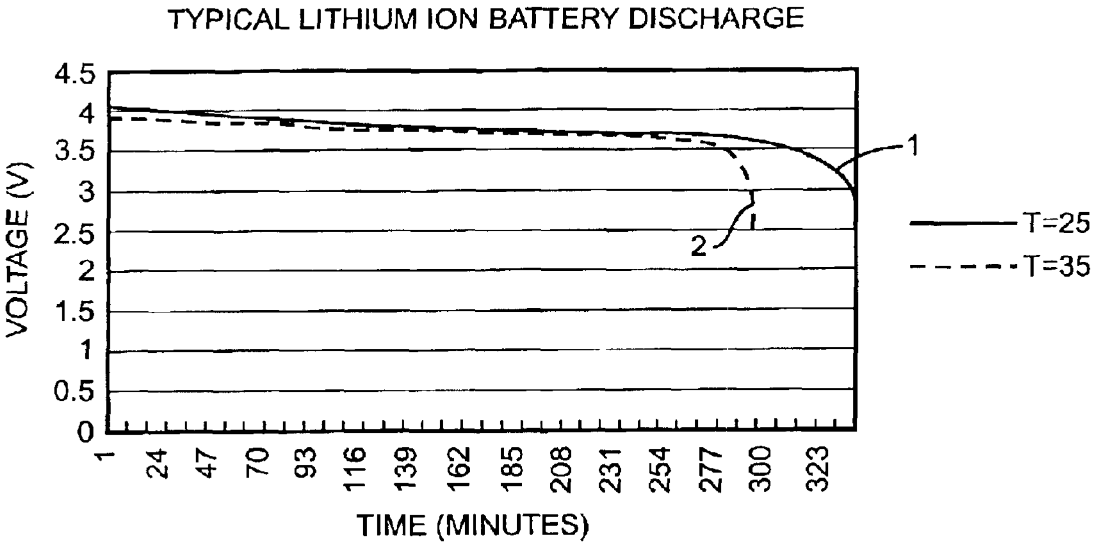
FIG. 1 is a graph depicting the voltage output of a lithium ion battery versus time.
Figure 2:
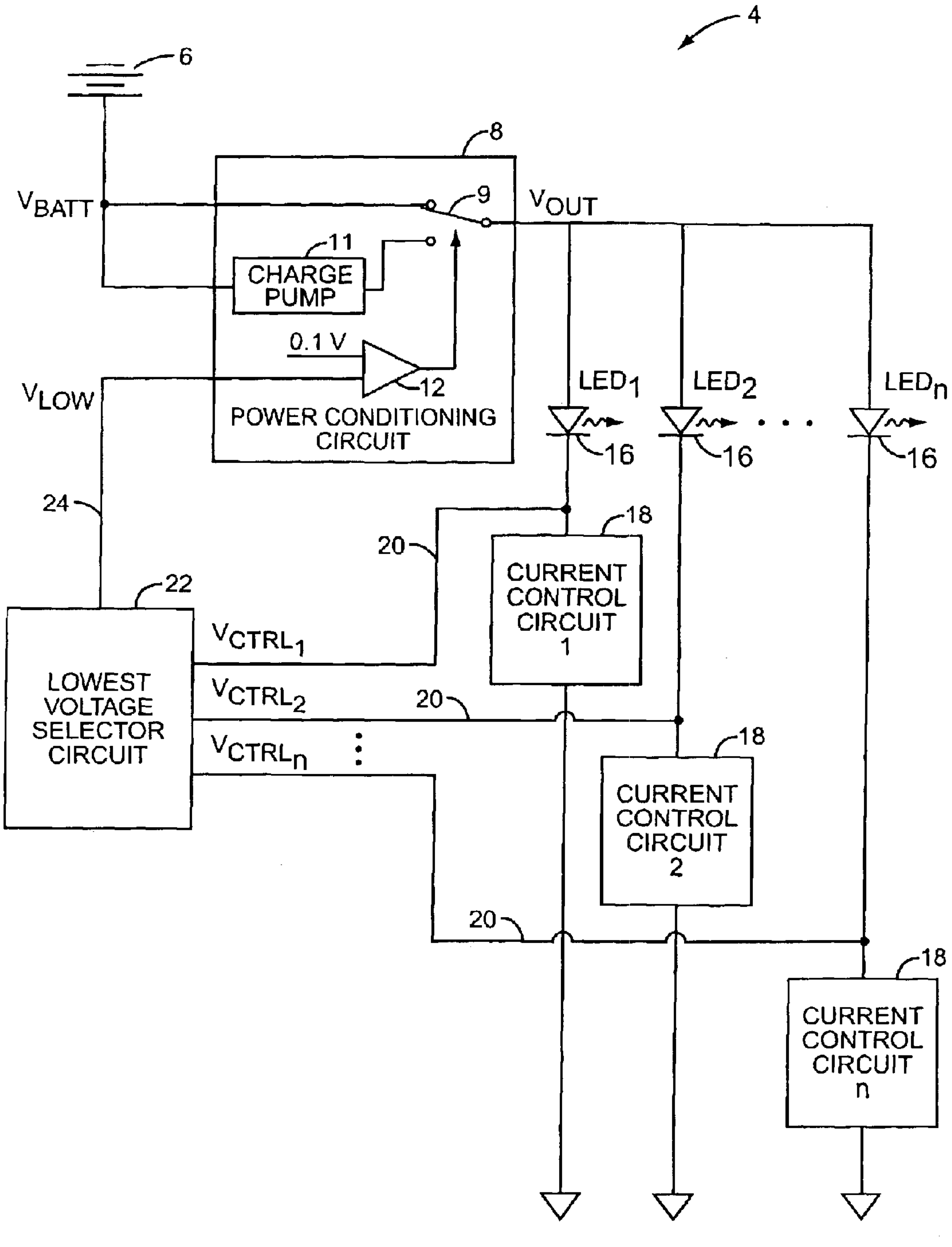
FIG. 2 is a block diagram of an efficient LED power supply system.

FIG. 2 depicts, in functional block diagram form, a power supply and current control circuit, indicated generally by the numeral 10, for driving a plurality of LEDs 16 from a battery 6, which is preferably a lithium ion battery having a discharge profile similar to that depicted in FIG. 1. The battery 6 provides an output voltage $V_{BATT}$ to a power conditioning circuit 8, which in turn provides an output voltage $V_{OUT}$. $V_{OUT}$ powers a plurality of LEDs 16, connected in parallel. Connected in series with each LED 16 is a current control circuit 18 that controls the current through the corresponding LED 16 to a predetermined level. The voltage drop across each current control circuit 18, measured at tap 20, is supplied to a lowest voltage selector circuit 22. The selector circuit 22 isolates and forwards the lowest of the tapped voltages, $V_{LOW}$ 24, to the power conditioning circuit 8.

Power conditioning circuit 8 operates in two modes. In a first, or battery mode, $V_{OUT}$ is taken directly from $V_{BATT}$, as depicted functionally by the position of switch 9. In the battery mode, the LEDs 16 are powered directly from the lithium ion battery 6. This mode is the most efficient, and will be employed throughout the majority of the lifetime of the battery 6 (e.g., the duration that $V_{BATT}$ exceeds 3.5V, as depicted in FIG. 1).

In a second, or boost mode, in which mode the switch 9 would assume the opposite configuration as that depicted in FIG. 2, $V_{BATT}$ is boosted by a predetermined factor, for example 1.5×, by charge pump 11, whose higher voltage output is supplied as $V_{OUT}$. The boost mode is employed when $V_{BATT}$ is insufficient to drive all LEDs 16 at the required intensity. Boost mode is typically entered at the end of the lifetime of the battery 6, e.g., when $V_{BATT}$ drops below 3.5V as depicted in FIG. 1. In an optional third mode, the charge pump may boost $V_{BATT}$ by a different factor, such as 2×. Other boost modes are possible, with different boost factors.

Although not depicted in FIG. 2, the power conditioning circuit 8 may optionally include circuits to effect voltage regulation, current limiting, over-voltage protection, and the like, as are well known to those of skill in the art. For example, voltage regulation may be combined with the mode selection switch 9 or the charge pump 11. One advantage of either approach is that low-$R_{DS-ON}$ switches in the main power path would not need to be as large in the silicon fabrication.

According to the present invention, the selection between the battery mode and the boost mode of the power conditioning circuit 8, indicated schematically by switch 9, and additionally selection between various boost factors in the various boost modes, is controlled by a comparison of the low voltage signal 24, $V_{LOW}$, to a threshold value, depicted schematically in FIG. 2 as a comparator 12. That is, the voltage drop $V_{CTRL}$ across each of the current control circuits 18 is monitored during battery mode. When the lowest current control circuit 18 voltage $V_{CTRL}$ (corresponding to the highest voltage drop across the corresponding LED 16) drops below a threshold value (such as for example $_{0.1}$V), the power conditioning circuit 8 switches from battery mode to boost mode.

Note that while this crossover point has been discussed, for convenience, with reference to FIG. 1, as being approximately 3.5V, the actual voltage $V_{BATT}$ of battery 6 at which the switchover occurs need not be 3.5V, or any other predetermined value of $V_{BATT}$. Rather, the switchover point is dynamically determined on an "as-needed" basis, and depends only on the relationship between $V_{BATT}$ and the largest forward voltage drop across the LEDs 16. Using a 0.1V threshold as an example, the power conditioning circuit 8 will switch from battery mode to boost mode when $V_{BATT}$ drops to the largest LED 16 voltage drop plus 0.1V. That is, the current control circuit 18 associated with the LED 16 exhibiting the largest forward voltage drop will itself exhibit the smallest voltage drop of all of the current control circuits 18. This voltage level will pass through the lowest voltage selector circuit 22, and be presented to the power conditioning circuit 8 as the low voltage signal 24, $V_{LOW}$. When $V_{LOW}$ falls to the threshold value of 0.1V, the comparator 12 output will actuate switch 9, transitioning to boost mode, and $V_{OUT}$ will be supplied by the charge pump 11. Note that the circuits depicted in the power conditioning circuit 8 are schematics intended to depict operational functionality, and may not represent actual circuits.

Figure 3:
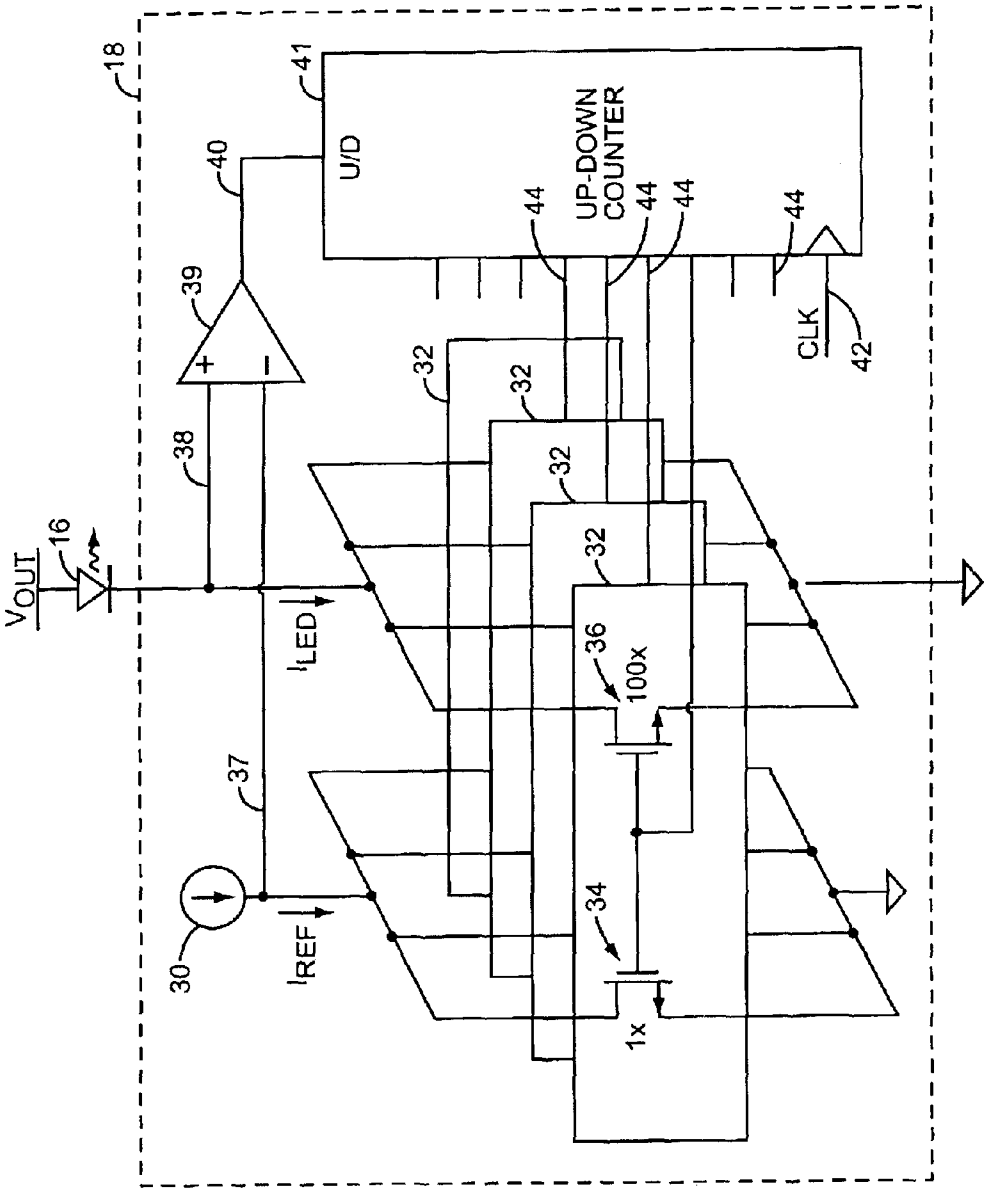
FIG. 3 is a functional block diagram of a current control circuit.

FIG. 3 depicts, in functional block diagram form, one embodiment of the current control circuit 18. Connected in series with an LED 16, the current control circuit 18 efficiently and accurately regulates the current flowing through the LED 16, and simultaneously adjusts its series resistance to compensate for the unknown forward voltage drop of the LED 16. The current control circuit 18 adjusts its series resistance by selectively switching in or out a plurality of resistive elements (such as MOSFETs 36) connected together in parallel. As used herein, a resistive element 36 is "switched in" to the circuit when current flows through the resistive element 36, and its characteristic resistance appears in parallel with one or more other resistive elements 36. The resistive element 36 is "switched out" of the circuit when its parallel branch appears as an open circuit, and little or no current flows through the resistive element 36. In the embodiment depicted in FIG. 3, the parallel resistive elements 36 that together form a variable resistance in series with LED 16, are implemented as MOSFETs.

The current $I_{LED}$ flowing through the LED 16 is controlled by a current mirror comprising a variable current source 30 and a parallel array of switched resistive elements 34, corresponding to the parallel array of switched resistive elements 36 in series with the LED 16. The desired current $I_{LED}$ is a predetermined multiple of the reference current $I_{REF}$ supplied by the current source 30 under user control (as explained more fully herein).

The resistive elements, in one embodiment MOSFETs 36 and 34, are connected at their respective gates, and are carefully constructed on a semiconductor integrated circuit to have a predetermined size (and hence resistance) relationship. For example, in an embodiment depicted in FIG. 3, if a reference MOSFET 34 is constructed with an area of X, its corresponding or mating MOSFET 36 (the two together forming a matched pair 32) is constructed with an area of 100×. Consequently, if the MOSFET 36 exhibits a characteristic resistance R, its corresponding or mating MOSFET 34 would exhibit a characteristic resistance of 100R. By driving the gates of MOSFETs 34 and 36 with a binary output, the MOSFETs are rendered either completely "off" or fully conductive. This maintains a relative high delta $V_{gs}$ across the MOSFETs, so that their resistances may more easily be matched. Since $V_{gs}$ is well above the MOSFETs' threshold voltage, the resistances of the MOSFETs are not subject to variation due to threshold voltage variation.

Each MOSFET 34, 36 in a matched pair 32 is constructed to maintain the same (e.g., 100×) size and, hence, resistance relationship—even though the actual size and hence resistance of the LED MOSFETs 36 (i.e, those that in parallel form the series resistance of current control circuit 18) differ from each other. That is, each LED MOSFET 36 in the parallel array is constructed to a different size and hence different resistance. In a preferred embodiment, the resistance values are binary weighted—for example, each successive LED MOSFET 36 in the parallel circuit exhibits twice (or half) the resistance of the previous LED MOSFET 36. Note that other relative weightings or multiples of resistance values are possible within the scope of the present invention.

Each successive reference MOSFET 34 in the parallel array, being matched in size to exhibit a resistance 100 times that of its mating LED MOSFET 36 in a matched pair 32, similarly is binary weighted, and will exhibit twice (or half) the resistance of the prior reference MOSFET 34. A significant benefit of the present invention is that the MOSFETs 34 and 36 of each matched pair 32 need only be matched in resistance to each other, and not to any other matched pair 32. This limitation dramatically improves yield and reduces manufacturing expense as compared to a solution in which each matched pair 32 must be matched to every other matched pair 32, or to a reference value. In this respect, those of skill in the art will note that the values of successive reference or LED MOSFETs 34 or 36 in a parallel array need exhibit only an approximate relationship—for example, approximately $2^n$X in the preferred embodiment case of binary weighting. The only matching that is critical is that within a given matched pair 32, the reference MOSFET 34 and LED MOSFET 36 should be carefully matched to exhibit the predetermined resistance relationship (e.g., 100×).

As the gates of MOSFETs 34 and 36 within each matched pair 32 are tied together, each MOSFET 34 and 36 in a matched pair 32 will be switched into or out of its corresponding parallel circuit simultaneously, under the control of a control signal 44. Thus, at any given time, the total resistance of the parallel array of reference MOSFETS 34 will be a predetermined multiple (e.g., 100×) of the total resistance of the parallel array of LED MOSFETs 36. If the voltage drops across the two parallel arrays of MOSFETs are equal, then the current $I_{LED}$ flowing through the LED 16 will be the same predetermined multiple (e.g., 100×) of the current $I_{REF}$ flowing from the current source 30.

Mathematically, $$V=I\ R;$$

$$V_{REF}=I_{REF}\ R_{REF} \text{ and } V_{LED}=I_{LED}\ R_{LED};$$

$$\text{if } V_{REF}=V_{LED}, \text{ then } I_{REF}\ R_{REF}=I_{LED}\ R_{LED}$$

$$\text{if, for example, } R_{REF}=100\ R_{LED} \text{ then}$$

$$I_{REF}\ 100\ R_{LED}=I_{LED}\ R_{LED} \text{ and}$$

$$I_{LED}=100\ I_{REF}.$$

Hence, by maintaining the voltage drops across the two parallel arrays of MOSFETS 34, 36 equal, the LED current $I_{LED}$ is controlled by varying the reference current $I_{REF}$. The current control circuit 18 maintains the voltage drops across the two parallel arrays of MOSFETs 34, 36 by switching the matched pairs 32 of the MOSFETs 34, 36 in and out of their respective circuits. The voltage drop across the reference resistance, tapped at 37, and the voltage drop across the LED resistance, tapped at 38, are compared at comparator 39, the output 40 of which is in turn the up/down control input to an up/down digital counter 41. The output bits 44 of the up/down counter 41 each control a matched pair 32 of MOSFETs 34, 36, switching them in or out their respective parallel resistive circuits. The up/down counter 41 is clocked by a periodic clock signal 42. The frequency of the clock signal 42 is preferably significantly longer than the decision time of comparator 39, and more preferably about ten times as long. This allows the transients created by switching in/out resistances to settle out prior to clocking the up/down counter 41 based on the new circuit operating point. The frequency of the clock signal 42 is driven by the ability of the human eye to perceive fluctuations in the intensity of light output by the LED. In a preferred embodiment, the clock signal 42 is approximately 1 MHz, although other frequencies are possible within the scope of the present invention.

In a preferred embodiment, the matched pairs 32 of resistive elements are binary weighted relative to other matched pairs 32, and the up/down counter 41 is a binary counter, with output bits 44 connected to control correspondingly weighted matched pairs 32. Note that other weightings of the matched pairs, and a corresponding weighting among the output bits 44 of a counter 41 (for example, a gray code pattern rather than binary), are possible within the scope of the present invention. Note also that FIG. 3 depicts only four matched pairs 32 of resistive elements 34, 36 for clarity. In a preferred embodiment, fourteen matched pairs 32 are employed in each current control circuit 18, with a corresponding 14-bit up/down counter 41. Other bit widths are possible within the scope of the present invention. Additionally, while the preferred embodiment has been discussed herein with resistive elements 34 and 36 implemented as MOSFETs, the present invention is not so limited. For example, each matched pair 32 may comprise a matched pair of resistors, each in series with a switch, the switches jointly controlled by a counter output bit 44. Other circuit implementations are also possible, within the scope of the present invention.

In operation, a reference current $I_{REF}$ is established (such as by user input or selection), and supplied by variable current source 30. The reference current $I_{REF}$, flowing through the parallel array of reference resistive elements 34, will establish a particular voltage drop across the parallel array of reference resistive elements 34. Simultaneously, an LED current $I_{LED}$ will flow through the LED 16, determined by the forward voltage drop across the LED 16 and the voltage drop across the parallel array of LED resistive elements 36. The difference in voltage drops across the two parallel arrays of resistive elements 34 and 36, as detected at comparator 39, will cause the up/down counter 41 to successively increment or decrement the binary code present at output bits 44. Each change in the state of the output bits 44 will cause one or more matched pairs 32 to switch its resistive elements 34 and 36 into or out of its respective parallel circuit, thus altering the LED path series resistance, the LED current $I_{LED}$, and hence the voltage sensed at comparator 39 via voltage tap 38. The output of comparator 39 will cause the up/down counter to again increment or decrement, further altering the resistance of parallel array of LED resistive elements 36. This process will continue iteratively until the voltage drops across the two parallel circuits are equal—that is, when the LED current $I_{LED}$) is a known multiple (e.g., 100×) of the reference current $I_{REF}$.

Figure 4:
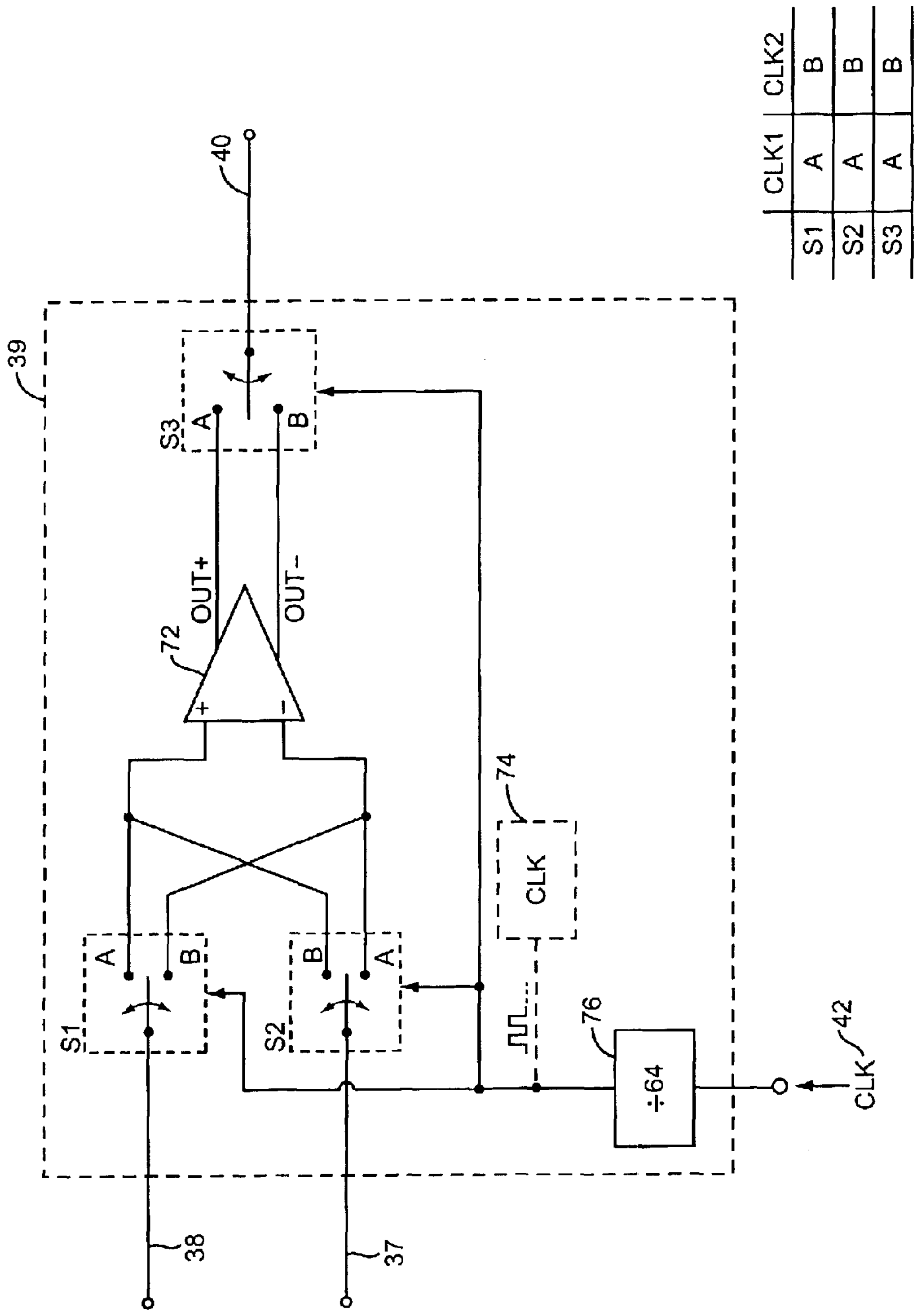
FIG. 4 is a functional block diagram of a polarity-switched comparator.

Transient effects, thermal drift, quantization errors, and the like may result in the up-down counter 41 failing to settle at a stable output bit pattern; rather, it may continuously step slightly above and below a stable output, in an ongoing state of "dynamic stability." Some of this dynamic activity may be due to amplifier offset errors at the comparator 39. In one embodiment, these errors are minimized by time-averaging them out. FIG. 4 illustrates exemplary details for a time-averaging embodiment of the comparator circuit 39, in which a differential amplifier 72 is configured as a polarity-switched comparator having its non-inverting and inverting inputs reversibly connected to the voltage tap inputs 37 and 38 through switches S1 and S2. Similarly, polarity-switched comparator 72 has its positive and negative outputs (VOUT+ and VOUT−) selectively coupled to output terminal 40 through switch S3. Note that "+" and "−" as used here connote relative signal levels and may not involve actual positive and negative voltages. In operation, a periodic clock signal provides a switching signal that drives switches S1, S2 and S3 such that the input and output connections of the polarity-switched comparator 72 are periodically reversed. The time-averaging comparator circuit 39 may include its own clock circuit 72 for local generation of the clocking signal. Alternatively, the clock for the comparator circuit 39 may be derived from the clock signal 42 that increments and decrements the up/down counter 41.

As indicated in the illustration, the first clock pulse, CLK1, sets switches S1 through S3 to the "A" connection and a subsequent clock pulse, CLK2, reverses the switches to the "B" setting. In this manner, a succession of input clock pulses causes switches S1 through S3 to periodically reverse their connections and thereby reverse the input and output signal connections of the polarity-switched comparator 72. As such, the duty cycle of the clock signal should be at or close to fifty percent to ensure that the comparator offsets actually average out over time. The effect of such polarity-switching operations is to null the comparator 39 offset errors that would otherwise manifest themselves as an error in the voltage comparison. That is, with a first switch setting, the offset errors of comparator 72 add to the sensed voltage differential, and with the opposite or reverse switch setting those same offset errors subtract from the sensed voltage differential.

In order to accurately average out the comparator 39 error, the error averaging time period should significantly exceed the count cycle time of the up/down counter 41. In a preferred embodiment, the clock for the comparator circuit 39 is derived from the up/down counter clock signal 42 at a divide-by-64 circuit 76. This allows the up/down counter 41 to settle at one error level, i.e., the amplifier offset error of the comparator circuit 39 connected one way, and stay at that settled value for a duration. The comparator circuit 39 then switches, and the up-down counter 41 will settle at the other error level, i.e., the amplifier offset error of the comparator circuit 39 connected the other way, for another duration. In this manner, the amplifier offset errors average out over time.

Referring back to FIG. 2, each current control circuit 18 independently controls the LED current $I_{LED}$ through its associated LED 16, by altering the effective series resistance and hence voltage drop across the current control circuit 18. This matches the current through each LED 16, in spite of their different, and unknown, forward voltage drops. This current control method additionally provides an indication that the voltage $V_{OUT}$—effectively, $V_{BATT}$ when the power conditioning circuit 8 is in battery mode—has dropped to a level slightly above the largest forward voltage drop among the LEDs 16. The voltage drop across each current control circuit 18, tapped at 20, is provided to the lowest voltage selector circuit 22.

Figure 5:
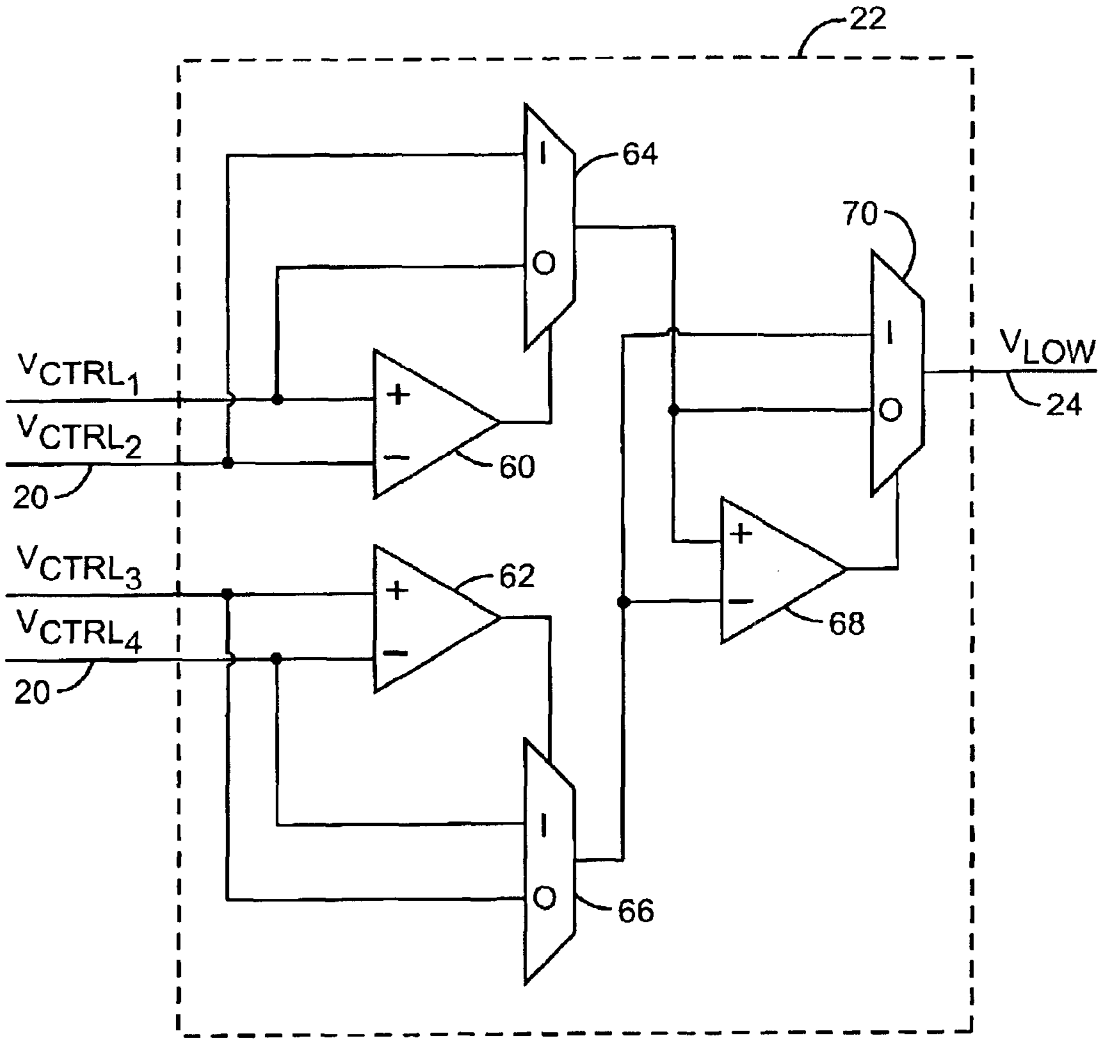
FIG. 5 is a functional block diagram of a lowest voltage selector circuit.

FIG. 5 depicts, in functional block diagram form, one embodiment of the lowest voltage selector circuit 22. Control voltages $V_{CTRL}$ (i.e., the voltage drops across current control circuits 18, taken at taps 20) are paired off and compared at comparators 60 and 62. The outputs of these comparators drive the select lines of multiplexers 64 and 66, connected to select the lowest of the two respective input control voltages $V_{CTRL}$ 20, as shown. The outputs of the multiplexer 64 and 66 are similarly passed to comparator 68 and the data inputs of multiplexer 70. The output of comparator 68 drives the select control input of comparator 70, connected to select the lower of the inputs. This "tree" of comparators and multiplexers may be expanded as necessary to accommodate the number of LEDs 16 in a given application. Unused inputs, such as in the case of an odd number of LEDs 16, may be tied high. The low voltage output 24, $V_{LOW}$, is the lowest voltage drop among the current control circuits 18, and corresponds to the LED 16 exhibiting the highest forward voltage drop. $V_{LOW}$ is compared to a threshold value in the power conditioning circuit 8, and when it falls below the threshold value (e.g., 0.1V), the power conditioning circuit 8 will switch from battery mode to boost mode, ensuring a $V_{OUT}$ sufficient to drive all LEDs 16 for the remainder of the battery life.

Figure 6:
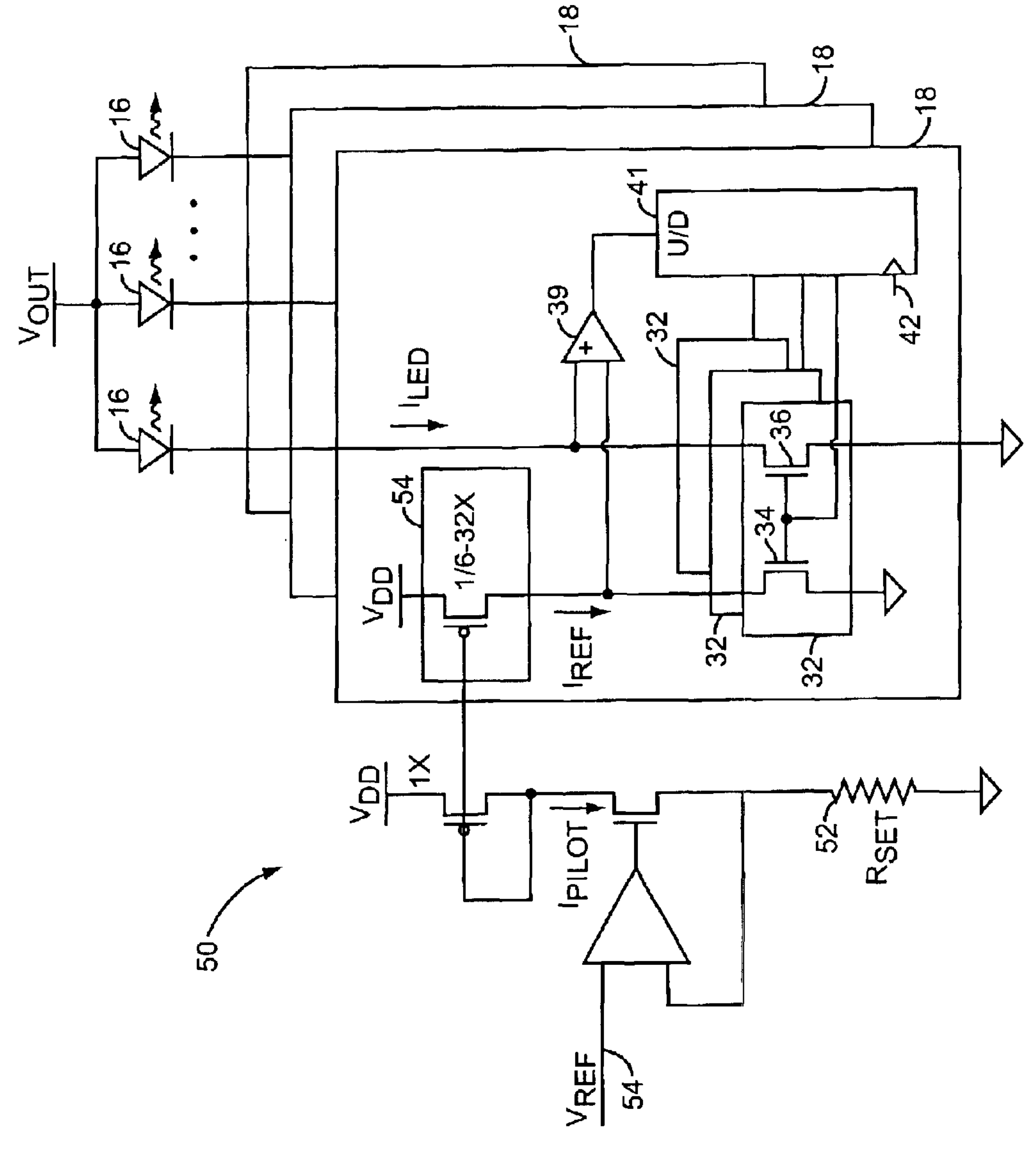
FIG. 6 is a block diagram of a reference current source for a plurality of current control circuits.

FIG. 6 depicts one embodiment of the variable current source 30 of current control circuits 18. A pilot current $I_{PILOT}$, is established and maintained by a pilot current circuit, indicated generally at 50. The value of $I_{PILOT}$ is determined by an external (user-adjustable) resistor 52 having a value $R_{SET}$, and a reference voltage 54 having a value $V_{REF}$. In a preferred embodiment, $V_{REF}$ may have a value equal to the bandgap voltage, which is typically in the range of 1.2V to 1.25V, with $R_{SET}$ selected accordingly to yield the desired $I_{PILOT}$. The pilot current circuit 50 is representative and not limiting; any current source circuit, as well known in the art, may be employed to generate $I_{PILOT}$, within the scope of the present invention.

A current $I_{REF}$, proportional to $I_{PILOT}$, is established in each current control circuit 18. The proportionality factor may be set by a Digital to Analog Converter (DAC) 54, which may for example multiply the pilot current $I_{PILOT}$ by a factor ranging from ⅙x to 32x. The current control circuit 18 is able to regulate over this wide range of current values, since all of the MOSFETs 34, 36 are kept in linear mode with the same high $V_{gs}$. The pilot circuit 50 supplies the same signal to each current control circuit 18, which may independently adjust the multiplier at DAC 54, to independently control the current through each LED 16, providing independent intensity control of each LED 16.

The present invention provides several advantages over prior art methods of LED current control. By using a digital up/down counter output to drive the variable resistances in a closed control loop, the desired LED current $I_{LED}$ is automatically slaved to the reference current $I_{REF}$. The voltage drop across the various current control circuits is additionally a ready indicator of the relative forward voltage drop of the associated LEDs, enabling the system to regulate the supply voltage to the worst-case of the differing—and unknown—LEDs, automatically. Also, by using a digital bit, or binary value, to drive the MOSFET resistive elements, a high $V_{gs}$ is maintained. This allows the MOSFETs to maintain good accuracy down to very low $V_{ds}$ values, and facilitates matching the MOSFETs' resistance values in each matched pair. The digital counter may additionally serve as a sample and hold circuit—its output value can be stored and reloaded, for example after the LEDs are turned off and back on. The digital nature of the present invention additionally facilitates various time-averaging methods for error control, as described herein. The variation in forward voltage drop among different LEDs is automatically compensated for, and the current (and hence brightness) may be precisely controlled with a small reference current. The switching between battery mode and boost mode is automatic, and will occur as late in the battery lifetime as possible, for the particular LEDs connected.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of controlling the current through an LED, comprising:

directing a first, predetermined current through a first digitally controlled variable resistance circuit;

directing a second current through a series circuit comprising said LED and a second digitally controlled variable resistance circuit having substantially a known ratio to said first variable resistance circuit;

altering a digital count based on a comparison of said first and second currents; and simultaneously altering said first and second variable resistance circuits based on said digital count.

2. The method of claim 1 wherein altering a digital count based on a comparison of said first and second currents comprises comparing the voltage drops across said first and second variable resistance circuits, and incrementing/decrementing a digital counter based on said comparison.

3. The method of claim 2 wherein comparing the voltage drops across said first and second variable resistance circuits comprises time-averaging a voltage comparator circuit by periodically switching comparator signal polarities to null comparator offset errors from the voltage comparison operation.

4. The method of claim 3 wherein periodically switching comparator signal polarities occurs at a lower frequency than altering said digital count.

5. The method of claim 4 wherein the frequency of switching comparator signal polarities is at least an order of magnitude lower than the frequency of altering said digital count.

6. The method of claim 1 wherein each of said first and second variable resistance circuits comprises a plurality of switched, fixed resistances connected in parallel, with each said fixed resistance in said first variable resistance circuit having substantially a known ratio to a corresponding fixed resistance in said second variable resistance circuit, the two said fixed resistances being simultaneously switched into or out of said respective first and second variable resistance circuits.

7. The method of claim 6 wherein said fixed resistances in said first and second variable resistance circuits correspond to said digital counter output bits, and wherein simultaneously altering said first and second variable resistance circuits based on said digital count comprises switching corresponding fixed resistances into or out of said first and second variable resistance circuits based on said respective digital counter output bits.

8. The method of claim 6 wherein within each of said first and second variable resistance circuits, each said fixed resistance is weighted relative to said other fixed resistances in a known relationship, and wherein said digital counter output bits are weighted in said known relationship.

9. The method of claim 8 wherein said fixed resistances and said digital counter output bits are binary weighted.

10. The method of claim 6 wherein said known ratio of fixed resistances in said first variable resistance circuit to corresponding fixed resistances in said second variable resistance circuit is about 0.01.

11. A method of independently controlling the current through a plurality of LEDs connected to a voltage source, comprising:

connecting each said LED to a current control source operative to alter the resistance of a variable resistance circuit in series with said LED so as to maintain the current through said LED at a known multiple of a local reference current;

providing a master reference current to each current control source, said master reference current determined by the value of a resistive element; and for each LED, multiplying said master reference current by a predetermined factor to generate said local reference current.

12. The method of claim 11 wherein said predetermined factor is a digital value.

13. The method of claim 11 wherein said predetermined factor varies from about ⅙ to about 32.

* * * * *